United States Patent [19]

Stolka et al.

[11] Patent Number: 5,264,312
[45] Date of Patent: Nov. 23, 1993

[54] CHARGE TRANSPORTING LAYERS FORMED FROM CURABLE COMPOSITIONS

[75] Inventors: Milan Stolka, Fairport; Ian D. Morrison; Bing R. Hseih, both of Webster, all of N.Y.

[73] Assignee: Xerox Corporatoin, Stamford, Conn.

[21] Appl. No.: 830,459

[22] Filed: Feb. 5, 1992

Related U.S. Application Data

[63] Continuation of Ser. No. 634,586, Dec. 27, 1990, abandoned.

[51] Int. Cl.$^5$ .............................................. G03G 5/00
[52] U.S. Cl. ................................... 430/130; 430/127; 430/96; 430/57
[58] Field of Search ..................... 430/130, 127, 96, 57

[56] References Cited

U.S. PATENT DOCUMENTS

| | | | |
|---|---|---|---|
| 4,275,133 | 6/1981 | Chu et al. | 430/59 |
| 4,296,190 | 10/1981 | Hasegawa et al. | 430/130 |
| 4,883,731 | 11/1989 | Tam et al. | 430/41 |
| 4,988,595 | 1/1991 | Pai et al. | 430/59 |

FOREIGN PATENT DOCUMENTS

1188330  4/1970  United Kingdom.

OTHER PUBLICATIONS

Patent Abstracts of Japan, vol. 13, No. 276, Jun. 26, 1989 Seiko Epson Corp., Mar. 13, 1989 & JP-A-166 656.
Xerox Disclosure Journal, vol. 4, No. 6, Dec. 1979, U.S., p. 711; Jan Bares: *Photoreceptor Preparation*.
Research Disclosure, No. 269, Sep. 1986, Emsworth, Hampshire, GB, p. 570; Anonymously: *Preparation of Photoconductor Structures Using UV Curing*.
I.B.M. Technical Disclosure Bulletin, vol. 29, No. 5, Oct. 1986, New York, U.S., p. 2256; *Preparation of a Charge-Generation Layer Using Electron Beam Curing*.

*Primary Examiner*—Marion E. McCamish
*Assistant Examiner*—S. Rosasco
*Attorney, Agent, or Firm*—Kenyon & Kenyon

[57] ABSTRACT

A process for preparing a photoreceptor by forming a coating of a substrate followed by curing. The coating contains an electroactive material dissolved or dispersed in a polymerizable film forming monomer, which is first polymerized into a solid matrix.

18 Claims, No Drawings

CHARGE TRANSPORTING LAYERS FORMED FROM CURABLE COMPOSITIONS

This application is a continuation of application Ser. No. 07/634,586, filed Dec. 27, 1990 now abandoned.

BACKGROUND OF THE INVENTION

In electrophotography, an electrophotographic plate containing a photoconductive insulating layer or layers is imaged by first uniformly electrostatically charging its surface. The plate is then exposed to a pattern of activating electromagnetic radiation such as light. The radiation selectively dissipates the charge in the illuminated areas of the photoconductive insulating layer while leaving behind an electrostatic latent image in the non-illuminated areas. This electrostatic latent image may then be developed to form a visible image by depositing finely divided electroscopic marking particles on the surface of the photoconductive insulating layer. The resulting visible image may then be transferred from the electrophotographic plate to a support such as paper. This imaging process may be repeated many times with reusable photoconductive insulating layers.

An electrophotographic imaging member may be a homogeneous layer of a single material such as vitreous selenium or may be a composite layer containing a photoconductor and another material, or may be several layers. One type of composite imaging material comprises a layer of finely divided particles of a photoconductive inorganic compound dispersed in an electrically insulating organic resin binder. U.S. Pat. No. 4,265,990 discloses a layered photoreceptor having separate photogenerating and charge transport layers. The photogenerating layer is capable of photogenerating holes and injecting the photogenerated holes into the charge transport layer. U.S. Pat. No. 5,149,609 filed on Dec. 14, 1990, titled, Novel Polymers for Photoreceptor Overcoating For Use As Protective Layer Against Liquid Xerographic Ink Interaction, discusses the various layers of a multilayered electrophotographic imaging member and is incorporated herein in its entirety by reference.

The charge transport layer of an imaging device may comprise any suitable transparent insulating organic polymer or nonpolymeric material capable of supporting the injection of photogenerated holes and electrons from the charge generating layer and allowing the transport of these holes or electrons through the organic layer to selectively discharge the surface layer.

An especially preferred transport layer employed in multilayer photoconductors comprises from about 25% to about 75% by weight of at least one charge transporting aromatic amine compound, and about 75% to 25% of a polymeric film forming resin in which the aromatic amine is soluble. The charge transport layer is preferably formed from a mixture of an aromatic amine compound of one or more compounds having the general formula:

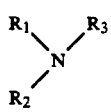

wherein $R_1$ and $R_2$ are aromatic groups selected from the group consisting of substituted or unsubstituted phenyl group, naphthyl group, and polyphenyl group and $R_1$ is selected from the group consisting of a substituted or unsubstituted aryl group, alkyl groups having one to eighteen carbon atoms, and cycloaliphatic compounds having from three to eighteen carbon atoms. The substituents should be free of electron withdrawing groups such as $NO_2$ groups and CN groups. Typical aromatic amine compounds that are represented by this structural formula include:

i. Triphenyl amines such as:

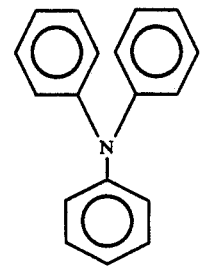

ii. Bis and polytriarylamines such as:

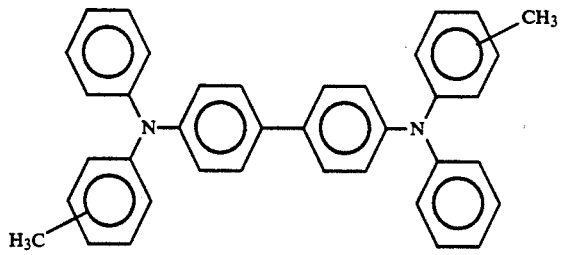

iii. Bis arylamine ethers such as:

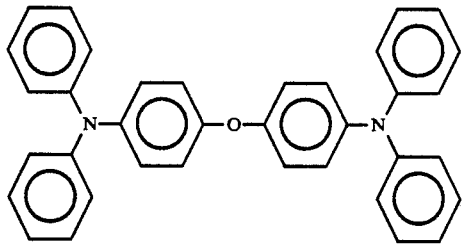

and iv. Bis alkyl-arylamines such as:

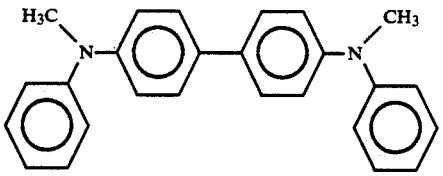

A preferred aromatic amine compound has the general formula:

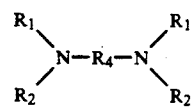

wherein $R_1$ and $R_2$ are defined above and $R_4$ is selected from the group consisting of a substituted or unsubstituted biphenyl group, diphenyl ether group, alkyl group having from one to eighteen carbon atoms, and cycloaliphatic group having from three to twelve carbon atoms. The substituents should be free of electron withdrawing groups such as $NO_2$ groups and CN groups.

Examples of charge transporting aromatic amines represented by the structural formula of above include triphenylmethane, bis(4-diethylamine-2-methylphenyl)-phenylmethane; 4'-4'''-bis(diethylamino)-2'2'''-dimethyl-triphenylmethane; N,N'-bis(alkylphenyl)-[1,1'-biphenyl]-4,4'-diamine wherein the alkyl is, for example, methyl, ethyl, propyl or N-butyl; N,N'-diphenyl-N,N'-bis(3''methylphenyl)-(1,1'biphenyl)-4,4'-diamine. The amines are dispersed in an inactive resin binder. Molecular weights of the amines can vary from about 20,000 to about 1,500,000.

The preferred electrically inactive resin materials are polycarbonate resins having a molecular weight from about 20,000 to about 120,000, more preferably from about 50,000 to about 100,000. The materials most preferred as the electrically inactive resin materials are poly(4,4'-dipropylidene-diphenylene carbonate) having a molecular weight from about 35,000 to about 40,000, available as Lexan 145 from General Electric Company; poly(4,4'-isopropylidene-diphenylene carbonate) with a molecular weight from about 40,000 to about 45,000, available as Lexan 141 from General Electric Company; a polycarbonate resin having a molecular weight of from about 50,000 to about 100,000, available as Makrolon from Farben Fabricken Bayer A.G.; a polycarbonate resin having a molecular weight of from about 20,000 to about 50,000, available as Merlon from Mobay Chemical Company; polyether carbonates; and 4,4'-cyclohexylidene diphenyl polycarbonate. Methylene chloride solvent is a desirable component of the charge transport layer coating mixture for adequate dissolving of all the components as it has a low boiling point. Other solvents that dissolve these binders include tetrahydrofuran, toluene, trichloroethylene, 1,1,2-trichloroethane, and 1,1,1-trichloroethane.

The charge transport layer of the electrophotographic plate is produced by dissolving the charge transporting material and the polymeric film forming resin in a volatile solvent, applying the solution by any of the usual coating techniques: e.g., spraying, dipping, roll coating, or extrusion, to form a uniform coating on the electrophotographic plate, and evaporating the volatile solvent. The polymeric film forming resin provides a matrix to support the charge transporting material which by itself would be too mechanically weak to be useful on an electrophotographic plate. The solvent provides the means by which the charge transporting material and the polymeric film forming resin can be mixed and formed into a uniform film. Therefore the combined purposes of the polymeric film forming resin and the solvent is to provide the means by which the charge transporting material can be coated and supported to provide a charge carrying path from the charge generating layer to the top surface. It is desirable to find a material that provides the function of the solvent and the polymeric film forming resin, that is, to provide a means by which the charge transporting material can be coated as a uniform layer on the electrophotographic plate and by which the charge transporting material can be made mechanically strong. It is also desirable to find a process by which the generation of volatiles is minimized or eliminated.

SUMMARY OF THE INVENTION

The present invention overcomes the problem of redundancy in the formation of the charge transport layer by using a curable monomer liquid to dissolve the transporting molecule. The formed liquid solution can then be coated onto a film in the usual coating processes, e.g., by spray, dip, roll coating or extrusion. The coated film is then cured to form the transport layer. During the curing process, the cured liquid forms the solid matrix, the properties of which can largely be controlled by the choice of curable monomer. Thus, in the process of the present invention, the curable liquid replaces both the coating solvent and the film forming polymer. The transporting molecule can be a small diamine molecule or a charge transporting polymer. If the transport molecule is a charge transporting polymer, the final coated and cured film would be an interpenetrating polymer network.

The process of the present invention has many advantages over the previous redundant process that include:

a) elimination of the solvent which both reduces cost and environmental impact;

b) increased mechanical strength and solvent resistance of the cured film because the curable liquid can be crosslinked using multifunctional monomers;

c) increased energy savings because curing systems require less energy than solvent drying;

d) increased adhesion between layers of the imaging member because curable liquids make intimate contact before curing;

e) decreased curl because curing can be accomplished at room temperature; and f) increase in the class of transporting molecules because monomers are compatible with more other molecules than polymer solutions.

The process is not dependent on the use of a specific curable liquid monomer as long as: a) the monomer is miscible (compatible) with the charge transporting molecule or charge transporting polymer, b) the resulting polymer is also compatible with the charge transporting molecule or polymer and c) the polymerization of the curable liquid does not cause a reaction with the charge transporting material. Particularly advantageous for this purpose are monomers such as vinyl ethers, epoxies and the like, which can be polymerized by ultraviolet-light induced cationic polymerization using photoinitiators that photolyze to strong acids, but free-radically polymerizable systems are also applicable.

Appropriate initiators include cationic initiators that photolyze to strong Lewis acids, such as aryldiazonium salts of the general formula $ArN_2^+X^-$ wherein Ar is an aromatic ring such as butyl benzene, nitrobenzene, dinitrobenzene, or the like and X is $BF_4$, $PF_6$, $AsF_6$, $SbF_6$, $CF_3SO_3$, or the like, diaryliodonium salts of the general formula $Ar_2I^+X^-$, wherein Ar is an aromatic ring such as methoxy benzene, butyl benzene, butoxy benzene, octyl benzene, didecyl benzene, or the like, and X is an ion of low nucleophilicity, such as $PF_6$, $AsF_6$, $BF_4$, $SbF_6$, $CF_3SO_3$, and the like; triarylsulfonium salts of the general formula $Ar_3S^+X^-$, wherein Ar is an aromatic ring such as hydroxy benzene, methoxy benzene, butyl benzene, butoxy benzene, octyl benzene, dodecyl benzene, or the like and X is an ion of low nucleophilicity, such as $PF_6$, $AsF_6$, $SbF_6$, $BF_4$, $CF_3SO_3$, or the like; nonradical initiators comprising amine salts of alphaketocarboxylic acids, such as the tributyl ammonium salt of phenylglyoxylic acid; and the like, as well as mixtures thereof. Further photoacid generating initiators are disclosed in "The Chemistry of Photoacid Generating Compounds," by J. V. Crivello in Proceedings of the ACS Division of Polymeric Materials: Science and Engineering, VOL 61, pages 62-66, (1989), "Redox Cationic Polymerization: The Diaryliodonium Salt/Ascorbate Redox Couple," by J. V. Crivello and J. H. W. Lam in Journal of Polymer Science: Polymer Chemistry Edition, Vol. 19, pages 539-548 (1981), "Redox-Induced Cationic Polymerization: The Diaryliodonium Salt/Benzoin Redox Couple," by J. V. Crivello and J. L. Lee in Journal of Polymer Science: Polymer Chemistry Edition, Vol. 21, pages 1097-1110 (1983), "Diaryliodonium Salts as Thermal Initiators of Cationic Polymerization," by J. V. Crivello, T. P. Lockhart and J. L. Lee in Journal of Polymer Science: Polymer Chemistry Edition, Vol. 21, pages 97-109 (1983), the disclosures of each which are totally incorporated herein by reference.

Further examples of suitable initiators include alpha-alkoxy phenyl ketones, o-acylated alpha-oximinoketones, polycyclic quinones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, alpha-halo alpha-phenylacetophenones, photoreducible dye-reducing agent redox couples, halogenated paraffins such as brominated or chlorinated parrafin, benzoin alkyl esters, cationic diborate anion complexes, anionic di-iodonium ion compounds, and anionic dye-pyrrilium compounds.

Additional examples of suitable initiators are disclosed in, for example U.S. Pat. No. 4,683,317, U.S. Pat. No. 4,378,277, U.S. Pat. No. 4,279,717, U.S. Pat. No. 4,680,368, U.S. Pat. No. 4,443,495, U.S. Pat. No. 4,751,102, U.S. Pat. No. 4,334,970, "Complex Triarylsulfonium Salt Photoinitiators I. The Identification, Characterization, and Syntheses of a New Class of Triarylsulfonium Salt Photoinitiators," J. V. Crivello and J. H. W. Lam, Journal of Polymer Science: Polymer Chemistry Edition, vol. 18, 2677-2695 (1980); "Complex Triarylsulfonium Photoinitiators II. The Preparation of several New Complex Triarylsulfonium Salts and the Influence of Their Structure in Photoinitiated Cationic Polymerization," J. V. Crivello and J. H. W. Lam, Journal of Polymer Science Polymer Chemistry Edition, Vol. 18, pages 2697-2714 (1980); "Diaryliodonium Salts A New Class of Photoinitiators for Cationic Polymerization," J. V. Crivello and J. H. W. Lam, Maromolecules, Vol. 10, pages 1307-1315 (1977); and "Developments in the Design and Applications of Novel Thermal and Photochemical Initiators for Cationic Polymerization" by J. V. Crivello, J. L. Lee and D. A. Conlon in Makromol. Chem. Macromolecular symposium, vol. 13/14, pages 134-160 (1988), the disclosures of each of which are totally incorporated herein by reference. Particularly preferred are the diaryl iodonium salts and their derivatives, the triaryl sulfonium salts and their derivatives, and the triphenyl phosphonium salts and their derivatives, with examples of derivatives being those with alkyl, aryl, or alkoxy substituents on the aryl rings. The initiator is present in the curable liquid in any effective amount, typically from about 0.1 to about 10 percent by weight of the liquid, and preferably from about 0.1 to about 3 percent by weight of the liquid.

Additionally, the method of the present invention is not limited solely to fabrication of a charge transport layer and can be used in the fabrication of other photoreceptor layers and in generating layers for non-photoreceptor applications. This method can be used in fabrication of layers containing charge carrier generating pigments or dyes, or layers containing other photoactive or electroactive materials.

DETAILED DESCRIPTION OF THE INVENTION

The following examples further illustrate the invention.

Example 1

An approximately 30% solution of AB-16 [N,N'-bis(4-methylphenyl) -N,N'-bis(4-ethylphenyl)-[1,1'-(3,3'-dimethyl)biphenyl]-4,4'-diamine], a hole transporting small molecule synthesized by Fuji-Xerox, in butanedioldivinyl ether was prepared by gentle heating. A small quantity of di(i-butylphenyl) iodinium hexafluoroarsenate initiator was added to the solution. The clear solution was then coated on a standard selenium-coated-aluminium plate and then cured in a UV oven, thus forming a photoreceptor having a transport layer. The formed transport layer of the photoreceptor was transparent and colorless. The coated and cured film was about 8 microns thick.

The photoreceptor was then tested on a flat plate scanner having 100 charge-discharge cycles. The results of 100 cycles of electrical testing are given in Table 1. The meaning of the measured voltages are: $V_0$ is the initial potential after charging, $V_{ddp}$ is the potential after 0.5 sec in the dark; $V_{bg}$ is the potential after exposure to light; $V_r$ is the residual potential after exposure to a strong erase light; $V_{cp}$ is the useful contrast voltage between the exposed and unexposed regions of this photoreceptor. A per cent-discharge for a photoreceptor of at least 50% is acceptable, greater than 80% is excellent. This photoreceptor had a 98% discharge. The photoreceptor properties remained constant over 100 cycles.

TABLE 1

| | |
|---|---|
| $V_O$ | −141.5 |
| $V_{ddp}$ | −128.5 |
| $V_{bg}$ | 10.0 |
| $V_r$ | 11.5 |
| $V_{cp}$ | −138.5 |
| % discharge | 98 |

EXAMPLE 2

The procedure of Example 1 was repeated except a 60% AB-16 , 40% bisphenol-A siloxy copolymer was used in place of the AB-16 of Example 1. The coated and cured film was about 10 microns thick. This photoreceptor had a high per cent discharge, although the charge acceptance decreased with the rapid cycling. The initial photoreceptor electrical properties are shown in Table 2.

TABLE 2

| | |
|---|---|
| $V_O$ | −213.0 |
| $V_{ddp}$ | −195.0 |
| $V_{bg}$ | −16.5 |
| $V_r$ | −14.0 |
| $V_{cp}$ | −178.5 |

TABLE 2-continued

| % discharge | 84 |
|---|---|

What is claimed is:

1. A process for preparing a photoreceptor comprising the steps of:
   a) dissolving an aromatic amine charge transporting material in a solvent consisting essentially of a polymerizable film forming monomer or a mixture of polymerizable film forming monomers to form a coating solution, said solvent subject to addition polymerization in the presence of a cationic initiator;
   b) coating a substrate with said coating solution; and
   c) photochemically curing said coating solution such that said monomer forms a polymer that is miscible with said aromatic amine charge transporting material.

2. The process of claim 1 wherein said polymerizable film forming monomer is a curable liquid monomer.

3. The process of claim 2 wherein said aromatic amine charge transporting material is a charge transporting molecule.

4. The process of claim 3 wherein said molecule is N,N'-bis(4-methylphenyl) -N,N'-bis(4-ethylphenyl)-[1,1'-(3,3'-dimethyl)biphenyl]4,4'-diamine.

5. The process of claim 2 wherein said aromatic amine charge transporting material is a charge transporting polymer.

6. The process of claim 5 wherein said polymer is a m-TBD/bisphenol-A siloxy copolymer.

7. The process of claim 2 wherein said curable liquid monomer is selected from the group consisting of epoxides, alkoxy styrenes, acrylates, methacrylates, and vinyl ethers.

8. The process of claim 7 wherein said curable liquid monomer is butanedioldivinyl ether.

9. The process of claim 1 wherein said aromatic amine charge transporting material is a charge transporting molecule.

10. The process of claim 9 wherein said molecule is N,N'-bis(4-methylpenyl)-N,N'-bis(4-ethylphenyl)-[1,1'-(3,3'-dimethyl)biphenyl]-4,4'-diamine.

11. The process of claim 1 wherein said aromatic amine charge transporting material is a charge transporting polymer.

12. The process of claim 11 wherein said polymer is a N,N'-diphenyl-N,N'-bis (3-methylphenyl)1,1'-diphenyl-4,4'-diamine/bisphenol-A siloxy copolymer.

13. The process of claim 1 wherein said cationic initiator initiator is added to said coating solution before coating said substrate.

14. A method for forming a charge transporting layer comprising:
   obtaining a curable coating solution comprising a vinyl ether curable liquid monomer; a photoinitiator selected from diaryl iodonium salts and their derivatives, triaryl sulfonium salts and their derivatives; and triphenyl phosphonium salts and their derivatives, and an aromatic amine charge transporting material comprising a compound of the genral formula:

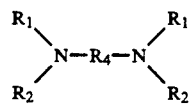

wherein $R_1$ and $R_2$ are aromatic groups selected from substituted or unsubstituted phenyl groups, naphthyl groups and polyphenyl groups, and wherein $R_4$ is selected from substituted or unsubstituted biphenyl groups, diphenyl ether groups, alkyl groups having from 1 to 18 carbon atoms, and cycloaliphatic groups having from 3 to 12 carbons;
   b) coating a substrate with said coating solution; and
   c) curing said coating solution such that said monomer forms a polymer that is miscible with said aromatic amine charge transporting material.

15. The method of claim 14 wherein said vinyl ether curable liquid monomer is butanedioldivinyl ether.

16. The method of claim 15 wherein said aromatic amine charge transporting material comprises N,N'-diphenyl-N,N'-bis (3-methylphenyl)1,1'-diphenyl-4,4'-diamine/bisphenol-A siloxy copolymer.

17. The method of claim 14 wherein said aromatic amine charge transporting material is N,N'-bis(4-methylphenyl) N,N'-bis(4-ethylphenyl)-(1,1'-(3,3'-dimethyl) biphenyl)-4,4'-diamine.

18. The method of claim 14 wherein said photoinitator is di(i-butylphenyl) iodinium hexafluoroarsenate.

* * * * *

UNITED STATES PATENT AND TRADEMARK OFFICE
CERTIFICATE OF CORRECTION

PATENT NO. : 5,264,312
DATED : November 23, 1993
INVENTOR(S) : Milan Stolka et al It is certified that error appears in the above-indentified patent and that said Letters Patent is hereby corrected as shown below:

Column 4 line 54 "$ArN_2+X-$" to read -- $ArN_2^+X^-$ --

Column 4 line 58 Change "$Ar_2I+X-$" to --$Ar_2I^+X^-$--.

Column 4 line 63 Change "$Ar_3S+X-$" to --$Ar_3S^+X^-$--.

Column 6, line 65 Change "$V_o$" to --$V_0$--.

Column 8, line 19 Change "genral" to --general--.

Signed and Sealed this

Twenty-first Day of June, 1994

Attest:

BRUCE LEHMAN

Attesting Officer        Commissioner of Patents and Trademarks